(12) United States Patent
Wang

(10) Patent No.: US 7,340,829 B2
(45) Date of Patent: Mar. 11, 2008

(54) METHOD FOR FABRICATING ELECTRICAL CONNECTION STRUCTURE OF CIRCUIT BOARD

(75) Inventor: Ying-Tung Wang, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 457 days.

(21) Appl. No.: 10/972,146

(22) Filed: Oct. 25, 2004

(65) Prior Publication Data
US 2006/0000877 A1    Jan. 5, 2006

(30) Foreign Application Priority Data
Jun. 30, 2004 (TW) ............................... 93119365 A

(51) Int. Cl.
*H01K 3/10* (2006.01)
(52) U.S. Cl. .......................... 29/852; 29/830; 29/842; 29/846; 29/853; 156/182; 156/230; 228/180.22; 257/E23.172; 257/E23.173; 257/E23.177
(58) Field of Classification Search .................. 29/852, 29/830, 842, 846, 853; 156/182, 230; 228/180.22; 257/E23.172, E23.173, E23.177
See application file for complete search history.

(56) References Cited
U.S. PATENT DOCUMENTS
5,209,817 A * 5/1993 Ahmad et al. ................ 216/18
5,426,849 A * 6/1995 Kimbara et al. .............. 29/830

FOREIGN PATENT DOCUMENTS
TW            508987         1/2003

* cited by examiner

*Primary Examiner*—A. Dexter Tugbang
*Assistant Examiner*—Tim Phan
(74) *Attorney, Agent, or Firm*—William F. Nixon; Clark & Brody

(57) ABSTRACT

A method for fabricating an electrical connection structure of a circuit board is proposed. The circuit board is provided with a plurality of pads on a surface thereof and with a plurality of conductive structures therein for electrically connecting the pad. A plurality of openings is formed penetrating through an insulating layer provided on the circuit board to expose the pad. Subsequently, a conductive base is attached to one surface of the circuit board for electrically connecting the pad. By such arrangement, a conductive material can be formed on the pad located on the other surface of the circuit board by an electroplating process via the conductive base, the pad on the surface, and the conductive structure within the circuit board.

11 Claims, 12 Drawing Sheets

METHOD FOR FABRICATING ELECTRICAL CONNECTION STRUCTURE OF CIRCUIT BOARD

FIELD OF THE INVENTION

The present invention relates to a method for fabricating an electrical connection structure of a circuit board, and more particularly, to a method for fabricating an electrical connection structure which provides electrical conduction between the circuit board and electrical elements.

BACKGROUND OF THE INVENTION

Referring to the current flip-chip technique, electrode pads are located on a surface of a semiconductor integrated circuit (IC) chip and a corresponding pad is provided on an organic circuit board. Solder bumps or other conductively adhesive materials are mounted on an active surface of the chip, which is provided on the top of the circuit board, such that the solder bump or other conductively adhesive material can be used as input/output connections for electrically and mechanically connecting the chip to the circuit board.

Referring to FIG. 1 which demonstrates a flip chip element known in the prior-art, a plurality of metal bumps 11 is formed on an electrode pad 12 of a chip 13, and a plurality of solder bumps 14 made of solder materials is formed on a pad 15 of an organic circuit board 16. Under a reflow temperature condition in which the solder bump 14 can be melted, the solder bump 14 is subject to a reflow process to make contact with a corresponding metal bump 11, so as to form a joint 17. Referring to a solder bump joint, a bottom cement material 18 such as underfill can be further filled in a gap between the chip and the circuit board, such that a thermal expansion difference existed between the chip 13 and the circuit board 16 can be prevented and a stress of the joint 17 can be reduced.

Recently, the solder material is deposited on the pad of the circuit board to form the solder bump by stencil printing technology. Referring to FIG. 2, the currently used stencil printing technology mainly provides a circuit board 20 having a solder mask layer 21 such as green paint on a surface thereof, and a plurality of pads 22 for forming locations of solder materials (not shown) such as solder pastes. Firstly, a stencil 23 having a plurality of grids 23a is provide on the circuit board 20. After coating the stencil 23 with the solder material, a roller 24 is repeatedly rolled on the stencil 23 or a spraying process is performed, such that the solder material is able to form a solder (not shown) on the pad using the gird 23a of the stencil 23 after the removal of the stencil 23. Subsequently, under a reflow temperature condition in which the solder can be melted, the solder is subject to a reflow process to form a solder bump on the pad of the substrate. Furthermore, the stencil of the foregoing stencil printing technology is preferably a steel plate.

During practical operation, along with the blooming development of various portable products in the fields of communication, networking and computing, packages such as ball grid array (BGA), flip chip, chip size package (CSP) and multi chip module (MCM) which are characterized with a miniaturized integrated circuit (IC) area, a high density and multiple legs have become the mainstream of the packaging market. Highly effective chips such as a microprocessor, a chip set and a drawing chip are usually combined with the foregoing package to achieve an operating function of a higher speed. However, circuits on a substrate and a dimension of a pad must be miniaturized for such structures to be applied. When the dimension of the pad and pitches are miniaturized, openings formed penetrating through the stencil also need to be reduced. Thus, a cost of stencil fabrication cannot be reduced due to difficulties in performing mold opening of the stencil. Also, it is of difficulties to allow the solder material to pass through the opening due to smallness of the opening.

Furthermore, referring to criteria on the production accuracy of the solder material, frequencies and cleanness of stencil printing have to be concerned in addition to a precise dimension of the stencil while performing the stencil printing technology. As the number of printings is increased, the solder material remained in a wall of the opening of the stencil is as well accumulated. Since the solder material is of a certain viscosity, the amount and shape of the solder material for performing next printing will be different from the specification if the solder material is previously accumulated. Therefore, the stencil has to be wiped out after performing a certain number of printings to ensure the cleanness of the stencil during practical operation, otherwise the shape and dimension of the solder material might be altered to cause an inconvenience as well as a decreased reliability in fabrication.

Referring to Taiwan Patent No. 508987 entitled "Method for fabricating solder on organic circuit board using electroplating process", a solder material can be formed on an opening area of a mask layer using an electroplating process. First of all, an organic circuit board having at least a pad is provided. An insulating layer is coated on the circuit board to expose the foregoing pad. Subsequently, a thin metal layer serving as a current conductive path is formed on the circuit board, and an electroplating resist layer is formed with a plurality of openings on the thin metal layer to expose the pads. A solder material is formed in the opening of the electroplating resist layer using an electroplating process prior to successively remove the electroplating resist layer and the thin metal layer being covered underneath the electroplating resist layer.

Although the foregoing method is able to eliminate drawbacks in the prior-art stencil printing technology, the procedures are very complex and the cost is very high. Also, when the solder material is formed on the pad using the electroplating process, the thin metal layer serving as the current conductive path might be affected by the electroplating resist layer located above the conductive layer, therefore contaminating the pad, the conductive layer and the fabricated solder material. Additionally, in order to form sufficient solder materials on the pad using the electroplating process, the criteria on the characteristics and thickness of the electroplating resist layer is very stringent, such that the fabrication is complicated as a consequence. Finally, during the subsequent removal of the electroplating resist layer, the fabricated solder material formed in the electroplating resist layer might be influenced to cause a reliability problem.

SUMMARY OF THE INVENTION

In light of the above prior-art drawbacks, a primary objective of the present invention is to provide a method for fabricating an electrical connection structure of a circuit board, by which difficulties in mold opening and an increase in a cost caused in prior-art stencil printing technology when sizes of openings of a stencil have to be reduced due to a miniaturized dimension of a pad and pitches can be avoided. Furthermore, a fabrication bottleneck that solder materials are not allowed to pass through the opening due to the smallness of the opening of the stencil can be eliminated.

Another objective of the present invention is to provide a method for fabricating an electrical connection structure of a circuit board, by which an inconvenience and a decreased reliability in fabrication caused by prior-art stencil printing technology can be prevented. In the stencil printing technology, as the number of printings is increased, the solder material remained in a wall of an opening of a stencil is as well accumulated, so as to influence the amount and shape of the solder material for performing the next printing. Thus, the stencil has to be wiped out to ensure the cleanness after performing a number of printings. The method for fabricating an electrical connection structure of a circuit board proposed in the present invention is capable of eliminating the foregoing drawback.

Still another objective of the present invention is to provide a method for fabricating an electrical connection structure of a circuit board, by which complex procedures and a high cost occurred when forming a solder material on a pad using an electroplating process as known in the prior-art can be eliminated.

A further objective of the present invention is to provide a method for fabricating an electrical connection structure of a circuit board, by which a reliability problem caused in the prior-art technique, in which a pad, a conductive layer and a fabricated solder material are contaminated as the conductive layer serving as a current conductive path is affected by an electroplating resist layer covered thereon during formation of the solder material on the pad using an electroplating process, can be solved.

In accordance with the foregoing and other objectives, the present invention proposes a method for fabricating an electrical connection structure of a circuit board. Referring to a preferable embodiment, first of all, a circuit board having a plurality of pads on a surface thereof and a plurality of conductive structures therein for electrically connecting the pad is provided. A plurality of openings is formed penetrating through an insulating layer provided on the circuit board to expose the pad. Subsequently, a conductive base is attached to one surface of the circuit board for electrically connecting the pad. A conductive material is formed on the pad located on the other surface of the circuit board by an electroplating process via the conductive base, the pad on the surface, and the conductive structure within the circuit board.

Referring to the foregoing method for fabricating the electrical connection structure of the circuit board proposed in the present invention, a circuit board having an internal circuit being completely electrically connected is provided. Conductive structures such as plated through holes (PTH), conductive vias and conductive circuits are formed within the circuit board, and a plurality of pads for electrically connecting the conductive structure is formed on a surface of the circuit board. Subsequently, a conductive base such as a metal plate is attached to one surface of the circuit board for electrically connecting the pad located on the same surface. By such arrangement, a conductive material such as a solder material can be formed on the pad located on the other surface of the circuit board by an electroplating process via the conductive base, the pad on the surface, and the conductive structure within the circuit board. After the conductive material is electroplated, the conductive base is removed. Therefore, the present invention is capable of effectively reducing a fabrication cost and eliminating a fabrication bottleneck caused in the prior-art stencil printing technology in which sizes of openings of a stencil have to be reduced due to a miniaturized dimension of a pad and pitches. Additionally, drawbacks such as an inconvenience and a reduced reliability in fabrication caused by the frequencies of printing and the cleanness of the stencil can be eliminated. The present invention is also capable of effectively eliminating complex procedures and minimizing the cost when the solder material is formed using an electroplating process as known in the prior-art. Moreover, a reliability problem caused in the prior-art technique, in which a pad, a conductive layer and a fabricated solder material are contaminated as a thin metal layer serving as a current conductive path is affected by an electroplating resist layer covered thereon during formation of the solder material on the pad using an electroplating process, can be solved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 3A to 3D are cross-sectional views of a method for fabricating an electrical connection structure of a circuit board according to the first embodiment of the present invention.

Figure 1:
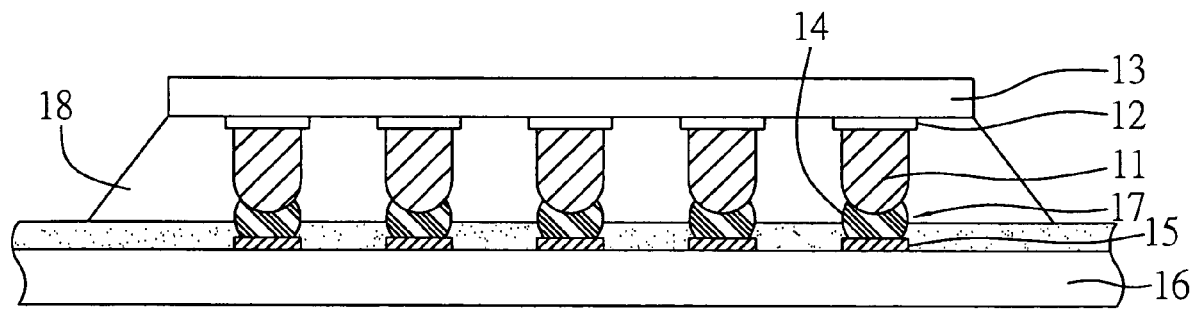
FIG. 1 (PRIOR ART) is a cross-sectional view of a conventional flip-chip semiconductor element.
Figure 2:
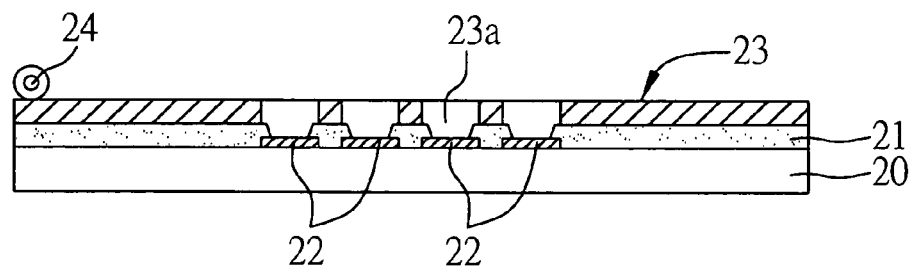
FIG. 2 (PRIOR ART) is a cross-sectional view of formation of a solder bump of a conventional circuit board using stencil printing technology known in the prior-art.
Figure 3A:
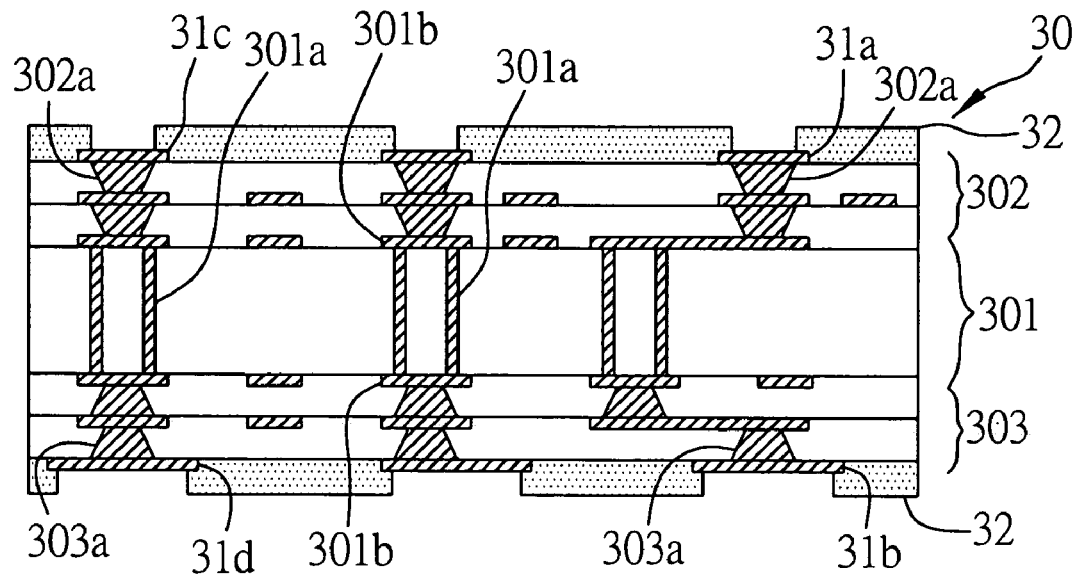
FIGS. 3A to 3D are cross-sectional views of a method for fabricating an electrical connection structure of a circuit board according to the first embodiment of the present invention.

Referring to FIG. 3A, a circuit board 30 having an internal circuit being completely electrically connected is provided. The circuit board 30 comprises a core circuit board 301 and a plurality of build-up circuit structures 302 and 303 formed on top and bottom surfaces of the core circuit board 301. Also, a plurality of pads 31a and 31b are formed on top and bottom surfaces of the circuit board 30. A plated through hole 301a formed penetrating through the core circuit board 301 is used for electrically connecting circuits 301b located on the top and bottom surfaces of the core circuit board 301. Similarly, a plurality of conductive vias 302a and 303a are used for electrically interconnecting the build-up circuit structures 302 and 303 respectively located on the top and bottom surfaces of the core circuit board 301, and for electrically connecting the core circuit board 301. Furthermore, a plurality of independent pads 31c and 31d are provided on the top and bottom surfaces of the circuit board 30. The independent pads 31c and 31d are electrically connected to each other by the means of the plated through hole 301a of the core circuit board 301 and the conductive vias 302a and 303a electrically connected to the plated through hole 301a on the top and bottom surfaces of the core circuit board 301. After completing fabrication of the build-up circuit structure of the circuit board 30, an insulating layer 32 such as a solder mask can be coated on the surface of the circuit board 30, such that the underneath circuit structure is protected. Additionally, a plurality of openings is formed penetrating through the insulating layer 32 to expose the pads 31a, 31b, 31c and 31d.

What needs to be concerned is that the types of the structure and the method of the fabrication of the circuit board are not limited by the present embodiment, which is described with the build-up multi-layer circuit board. Therefore, any circuit board having double or multiple layers of circuits in which the circuits on the top and bottom surfaces can be electrically connected can be applied to the present invention depending on practical requirements.

Figure 3B:
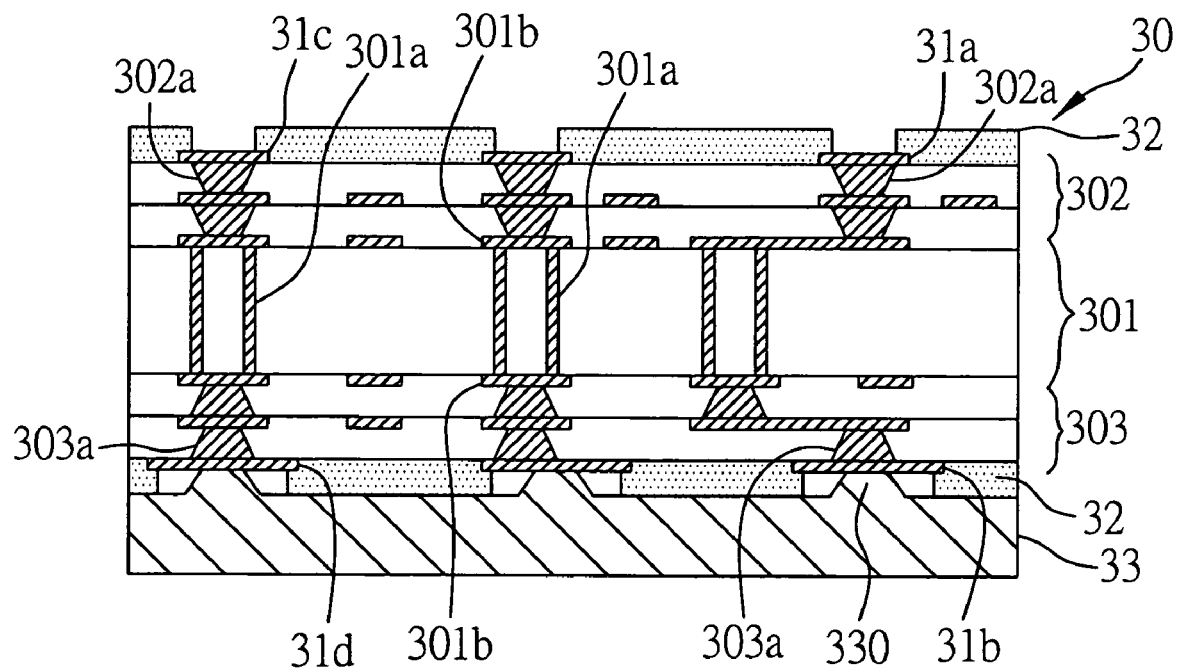

Referring to FIG. 3B, a conductive base 33 is attached to the bottom surface of the circuit board. The conductive base can be preferably a metal plate being provided with a plurality of bumps 330, such that the bump can insert into the opening of the insulating layer 32 to connect the pad 31 (including the independent pad 31d located on the bottom surface) located on the bottom surface of the circuit board 30.

Figure 3C:
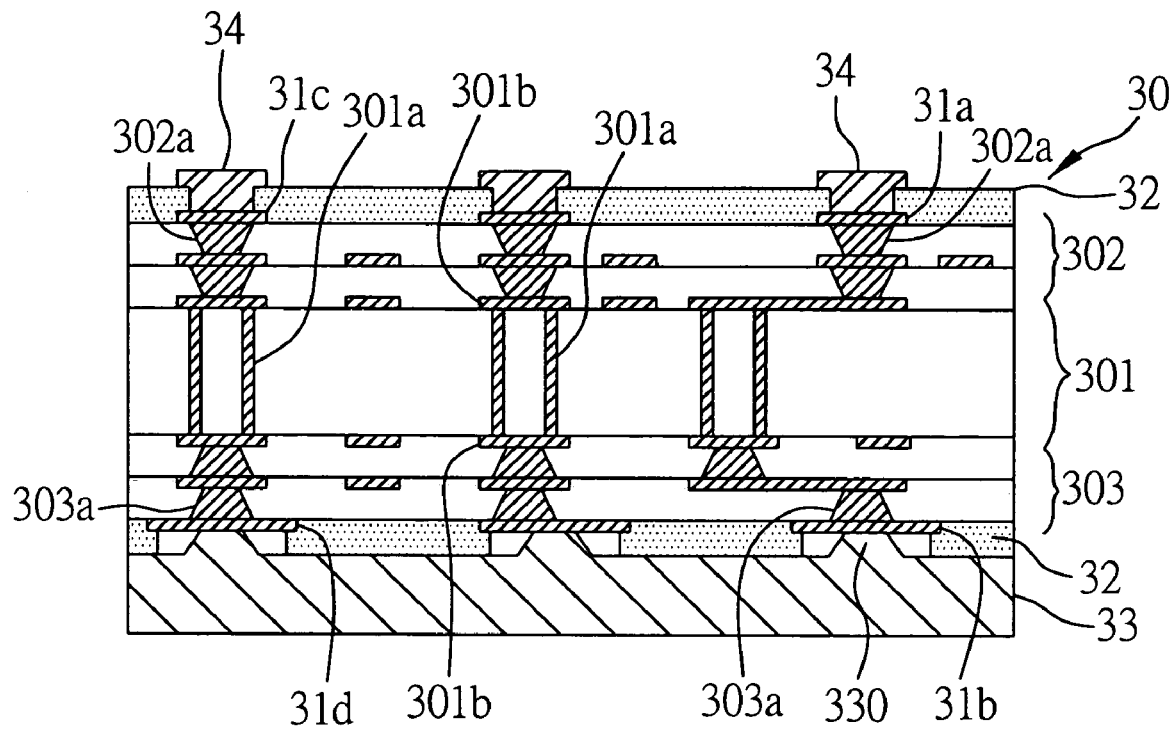

Referring to FIG. 3C, a conductive material 34 such as a solder material is formed on the pad 31a located on the top surface of the circuit board 30 using an electroplating process via conductive structures including the conductive base 33, the pad 31b and the build-up circuit structure 303 located on the bottom surface of the circuit board, the core circuit board 301 and the build-up circuit structure 302 located on the top surface of the circuit board. Also, the conductive material 34 can be formed on the independent pad 31c located on the top surface of the circuit board using an electroplating process via the conductive structures including the conductive base 33, the pad 31d, the conductive via 303a electrically connected to the bottom of the plated through hole 301a, the plated through hole 301a and the conductive via 302a formed on the top of the plated through hole 301a. Furthermore, apart from the solder material, the conductive material 34 can be a general metal bump, such that the circuit board can be electrically connected to electronic elements by the means of the conductive material.

Figure 3D:
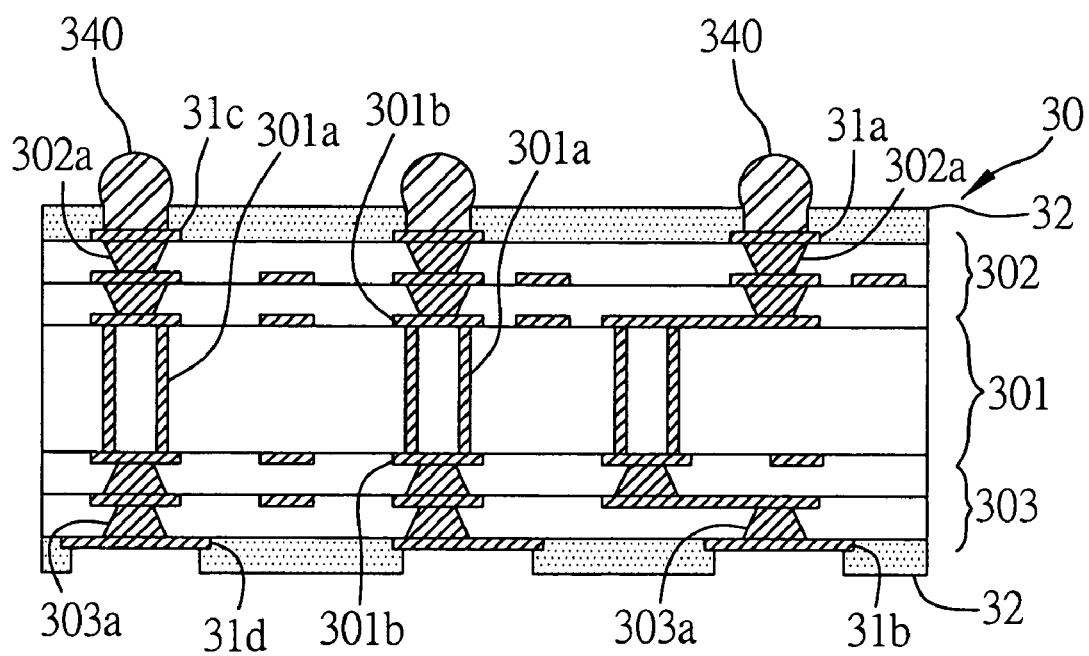

Referring to FIG. 3D, after the conductive material 34 such as the solder material is formed using the electroplating process, the conductive base 33 can be removed and the solder material is subject to a reflow process to form a solder bump 340. The surface of the circuit board of forming the solder bump 340 is used as a chip mounting area, such that a semiconductor chip can be subsequently mounted on and electrically connected to the solder bump 340.

Referring to the foregoing method for fabricating the electrical connection structure of the circuit board proposed in the present invention, a circuit board having an internal circuit being completely electrically connected is provided. The conductive structures such as the plated through hole (PTH), the conductive via and the conductive circuit are formed within the circuit board, and a plurality of pads for electrically connecting the conductive structure is formed on the surface of the circuit board. Subsequently, the conductive base is attached to a surface of the circuit board for electrically connecting the pad located on the surface of the circuit board. By such arrangement, the conductive material can be formed on the pad located on the other surface of the circuit board by an electroplating process via the conductive base, the pad on the surface, and the conductive structure within the circuit board. After the conductive material is electroplated, the conductive base is removed. Therefore, accuracy and reliability problems of fabrication using the prior-art stencil printing technology can be effectively solved while further eliminating complex procedures and reducing a high cost caused in the prior-art fabrication with an electroplating process.

FIGS. 4A to 4D are cross-sectional views of a method for fabricating an electrical connection structure of a circuit board according to the second embodiment of the present invention. The fabrication shown in the second embodiment of the present invention is similar to that of the first embodiment. The main difference is that the individual pads located on the top and bottom surfaces of the circuit board are electrically connected by the means of a conductive hole formed penetrating through the circuit board.

Figure 4A:
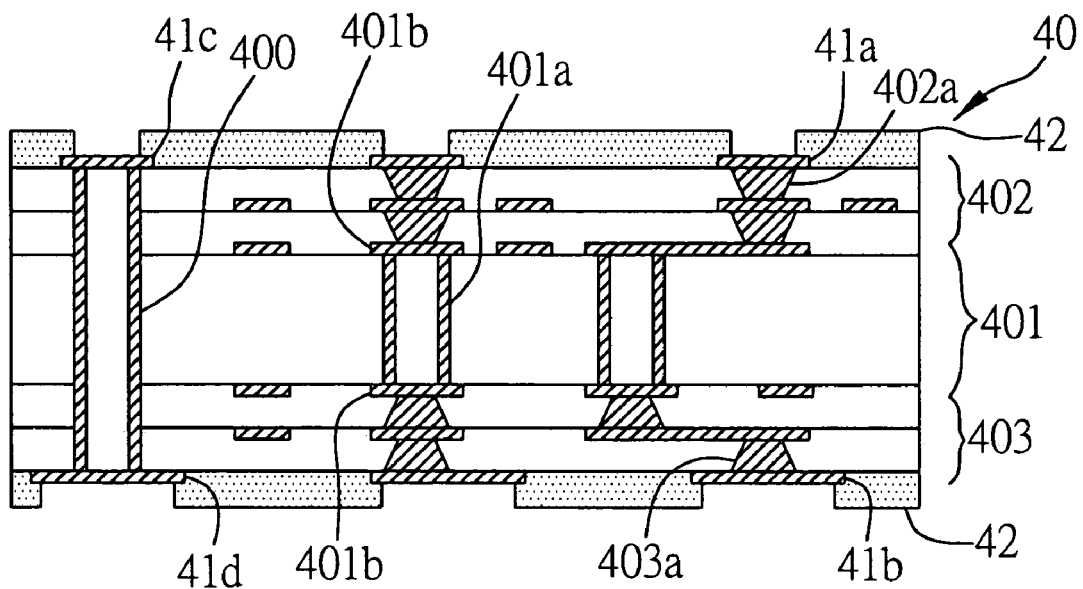
FIGS. 4A to 4D are cross-sectional views of a method for fabricating an electrical connection structure of a circuit board according to the second embodiment of the present invention.

Referring to FIG. 4A, a circuit board 40 having an internal circuit being completely electrically connected is provided. The circuit board 40 comprises a core circuit board 401 and a plurality of build-up circuit structures 402 and 403 formed on top and bottom surfaces of the core circuit board 401. Also, a plurality of pads 41a and 41b are formed on top and bottom surfaces of the circuit board 40. A plated through hole 401a formed penetrating through the core circuit board 401 is used for electrically connecting circuits 401b located on the top and bottom surfaces of the core circuit board 401. Similarly, a plurality of conductive vias 402a and 403a are used for electrically interconnecting the build-up circuit structures 402 and 403 respectively located on the top and bottom surfaces of the core circuit board 401, and for electrically connecting the core circuit board 401. Furthermore, a plurality of independent pads 41c and 41d are provided on the top and bottom surfaces of the circuit board 40. The independent pads 41c and 41d are electrically connected to each other by the means of a conductive hole 400 formed penetrating through the circuit board 40. After completing fabrication of the build-up circuit structure of the circuit board 40, an insulating layer 42 can be coated on the surface of the circuit board 40, such that the underneath circuit structure is protected. Additionally, a plurality of openings is formed penetrating through the insulating layer 42 to expose the pads 41a, 41b, 41c and 41d.

Figure 4B:
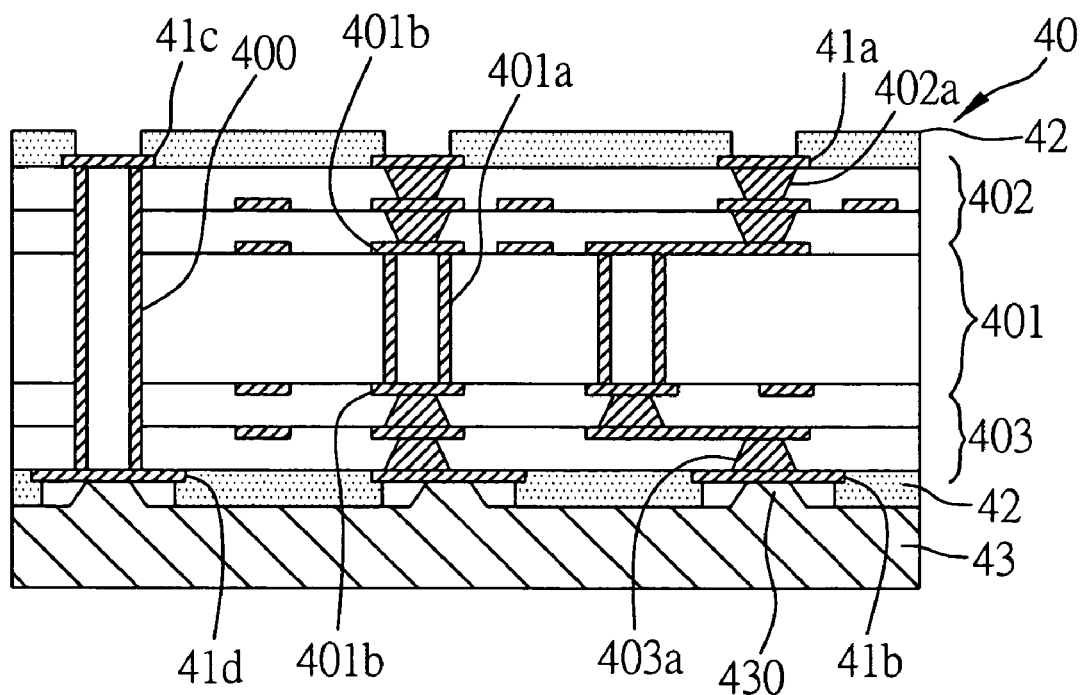

Referring to FIG. 4B, a conductive base 43 is attached to the bottom surface of the circuit board 40. The conductive base can be preferably a metal plate being provided with a plurality of bumps 430, such that the bump can insert into the opening of the insulating layer 42 to connect the pad 41b (including the independent pad 41d located on the bottom surface) located on the bottom surface of the circuit board 40.

Figure 4C:
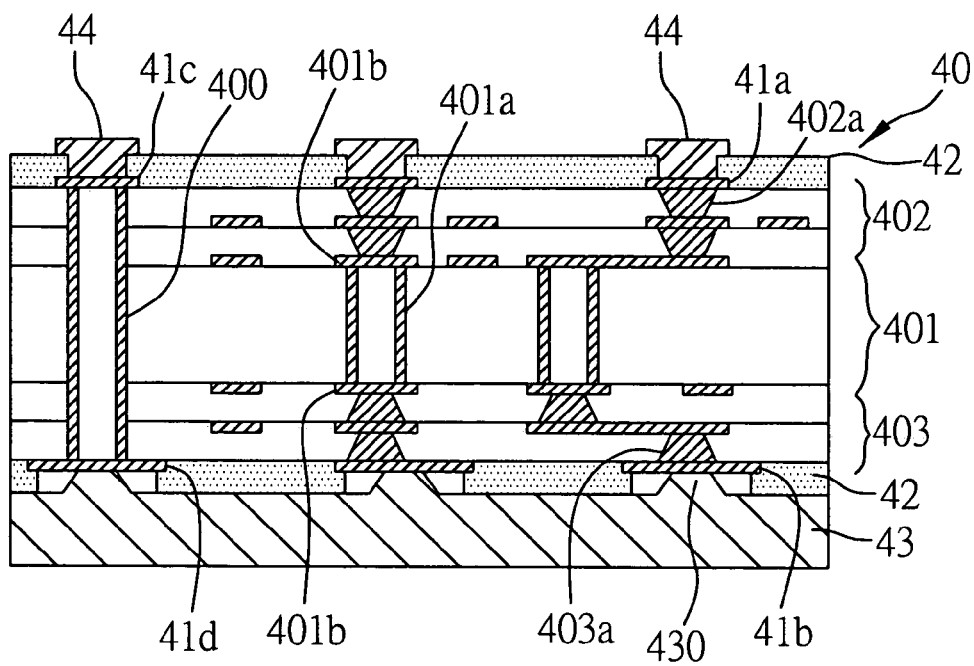

Referring to FIG. 4C, a conductive material 44 such as a solder material is formed on the pad 41a located on the top surface of the circuit board 40 using an electroplating process via conductive structures including the conductive base 43, the pad 41b and the build-up circuit structure 403 located on the bottom surface of the circuit board, the core circuit board 401 and the build-up circuit structure 402 located on the top surface of the circuit board. Also, the conductive material 44 can be formed on the independent pad 41c located on the top surface of the circuit board 40 using an electroplating process via the conductive via 400 formed penetrating through the circuit board 40.

Figure 4D:
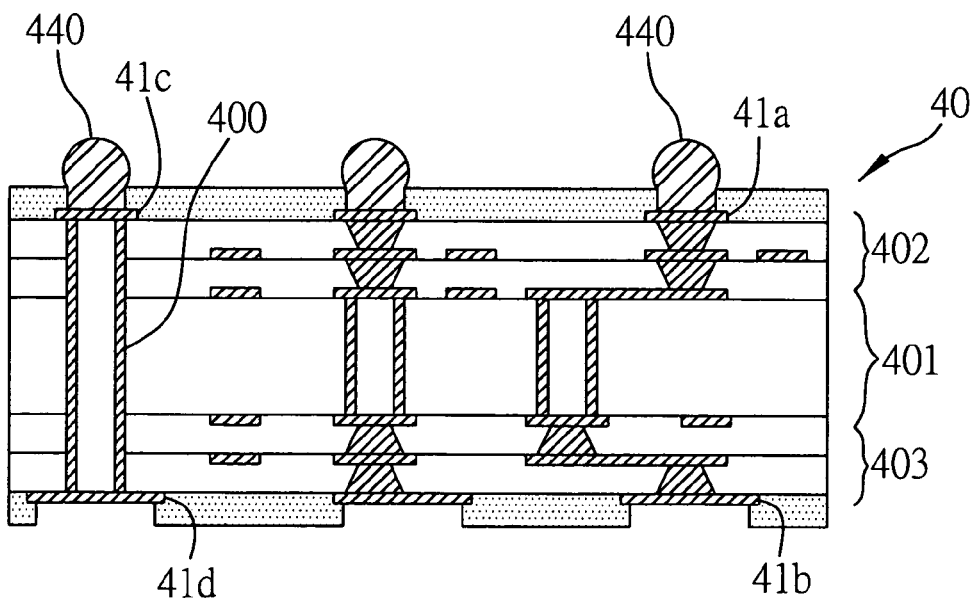

Referring to FIG. 4D, after the conductive material 44 such as the solder material is formed using the electroplating process, the conductive base 43 can be removed and the solder material is subject to a reflow process to form a solder bump 440.

FIGS. 5A to 5E are cross-sectional views of a method for fabricating an electrical connection structure of a circuit board according to the third embodiment of the present invention. The fabrication shown in the third embodiment of the present invention is similar to that of the first embodiment. The main difference is that the independent pads located on the surfaces of the circuit board can be electrically connected by a conductive structure preset in an electrically inactive area of the circuit board. Also, when the conductive base is subsequently connected to the independent pad located on a surface of the circuit board, the conductive structure in the electrically inactive area of the circuit board can serve as a current conductive path to form a conductive material on the independent pad located on the other surface. Then, the conductive structure in the electrically inactive area of the circuit board is removed.

Figure 5A:
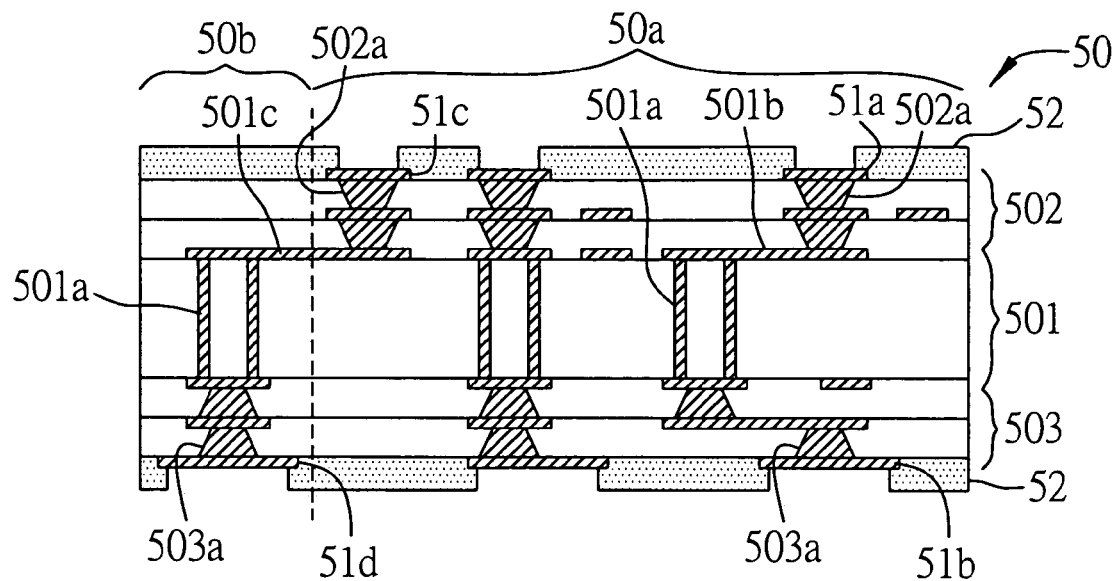
FIGS. 5A to 5E are cross-sectional views of a method for fabricating an electrical connection structure of a circuit board according to the third embodiment of the present invention.

Referring to FIG. 5A, a circuit board 50 having an internal circuit being completely electrically connected is provided. The circuit board 50 can be divided into an electrically active area 50a and an electrically inactive area 50b set surrounding the electrically active area 50a. The circuit board 50 comprises a core circuit board 501 and a plurality of build-up circuit structures 502 and 503 formed on top and bottom surfaces of the core circuit board 501. Also, a plurality of pads 51a and 51b are formed on top and bottom surfaces of the circuit board 50. A plated through hole 501a formed penetrating through the core circuit board 501 is used for electrically connecting circuits 501b located on the top and bottom surfaces of the core circuit board 501. Similarly, a plurality of conductive vias 502a and 503a are used for electrically interconnecting the build-up circuit structures 502 and 503 respectively located on the top and bottom surfaces of the core circuit board 501, and for electrically connecting the core circuit board 501. Furthermore, a plurality of independent pads 51c and 51d are provided on the top and bottom surfaces of the circuit board 50. The independent pads 51c and 51d are electrically connected to each other by the means of conductive structures set in the electrically inactive area 50b of the circuit board 50. After completing fabrication of the build-up circuit structure of the circuit board 50, an insulating layer 52 can be coated on the surface of the circuit board 50, such that the underneath circuit structure is protected. Additionally, a plurality of openings is formed penetrating through the insulating layer 52 to expose the pads 51a, 51b, 51c and 51d.

The conductive structure in the electrically inactive area 50b of the circuit board is shown as in FIG. 5A. A circuit 501c is extended from the top of the plated through hole 501a of the core circuit board 501 located in the electrically inactive area 50b to the electrically active area 50a of the circuit board. Thus, during the fabrication of the build-up circuit structure of the circuit board 50, the conductive via 502a can be formed on the extended circuit 501c and the independent pad 51c can be formed. In the meanwhile, the independent pad 51d can be formed on the conductive via 503a located on the bottom of the plated through hole 501a within the electrically inactive area 50b. Therefore, a conductive base can be subsequently attached to the independent pad 51d located on the bottom, which is electrically connected to the independent pad 51c located on the top by the means of the conductive via 503a located on the bottom, the plated through hole 501a and the conductive via 502a located on the top, thereby forming a conductive material thereon using an electroplating process.

Figure 6:
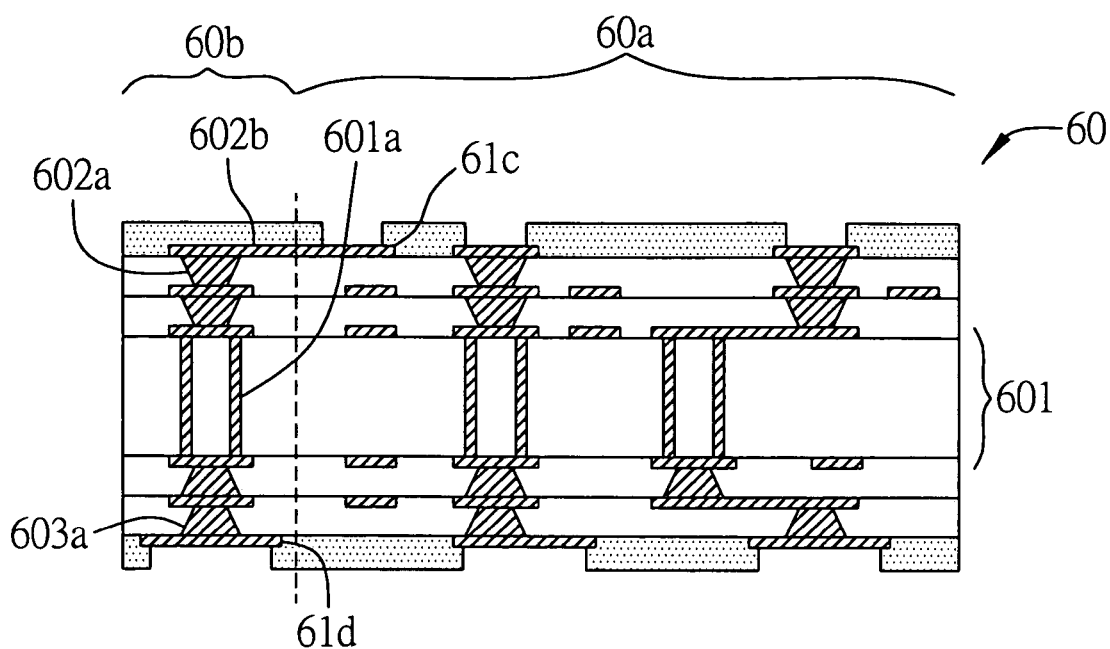
FIG. 6 is a view of a circuit board structure employing a method for fabricating an electrical connection structure of a circuit board according to the present invention.

The conductive structure in the electrically inactive area 50b of the circuit board is, of course, not limited by the foregoing embodiment. Referring to FIG. 6, during the fabrication of the build-up circuit structure of a circuit board 60, conductive vias 602a and 603a can be formed on the top and bottom of a plated through hole 601a of a core circuit board 601 located in an electrically inactive area 60b. Thus, the conductive via 603a located on the bottom forms an independent pad 61d, and a circuit 602b is extended from the conductive via 602a to electrically connect an independent pad 61c located in an electrically active area. Therefore, a conductive base can be subsequently attached to the independent pad 61d located on the bottom, which is electrically connected to the independent pad 61c located on the top by the means of the conductive via 603a located on the bottom, the plated through hole 601a and the conductive via 602a located on the top, thereby forming a conductive material thereon using an electroplating process.

Figure 7:
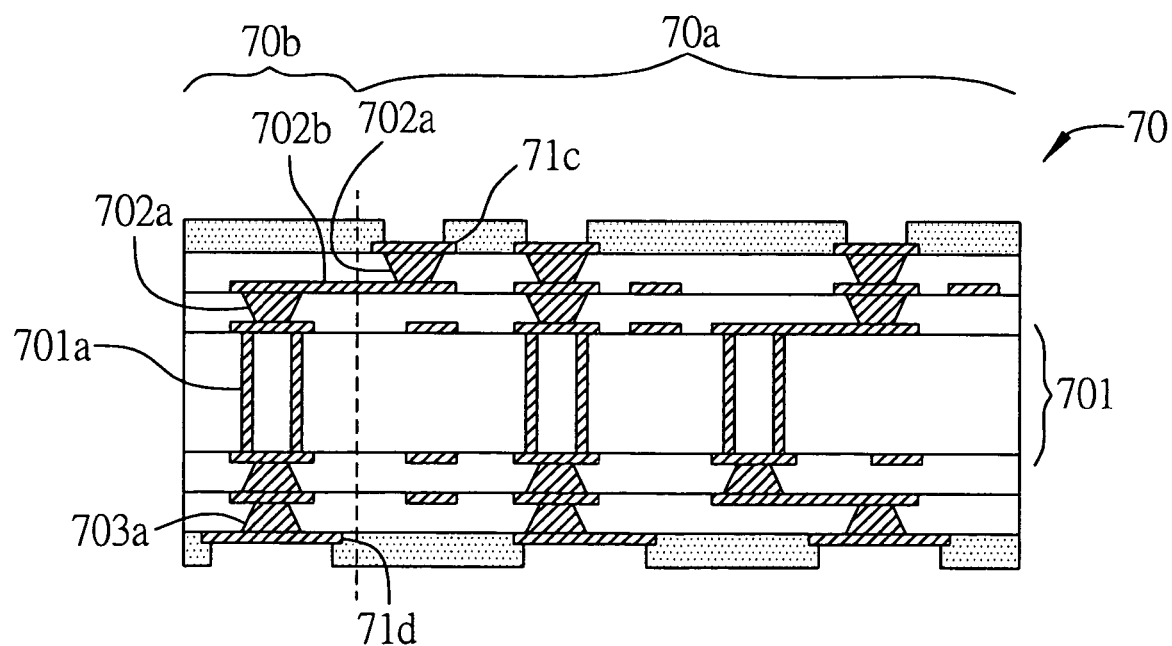
FIG. 7 is another view of a circuit board structure employing a method for fabricating an electrical connection structure of a circuit board according to the present invention.

The conductive structure in an electrically inactive area of the circuit board is also shown as in FIG. 7. During the fabrication of the build-up circuit structure of a circuit board 70, conductive vias 702a and 703a can be formed on the top and bottom of a plated through hole 701a of a core circuit board 701 located in an electrically inactive area 70b of the circuit board 70. Thus, the conductive via 703a on the bottom forms an independent pad 71d, and a circuit 702b is extended from the conductive via 702a to an electrically active area 70a prior to form the conductive via 702a and an independent pad 71c on the extended circuit 702b. Therefore, a conductive base can be subsequently attached to the independent pad 71d located on the bottom, which is electrically connected to the independent pad 71c located on the top by the means of the conductive via 703a located on the bottom, the plated through hole 701a and the conductive via 702a located on the top, thereby forming a conductive material thereon using an electroplating process.

What needs to be concerned is that the conductive structure located in the electrically inactive area of each of the foregoing circuit boards only serves to provide description for the present invention with no intent to limit the scope of the invention. Therefore, any conductive structure located in the electrically inactive area of the circuit board for electrically connecting independent pads respectively located on the top and the bottom. of the circuit board can be applied to the present invention. Moreover, the following drawings only serve to provide further description for the method of subsequently fabricating conductive materials on the circuit board using an electroplating process shown in FIG. 5A. The fabrication methods using an electroplating process as shown in FIGS. 6 and 7 are similar to that in FIG. 5A, and therefore are not further described.

Figure 5B:
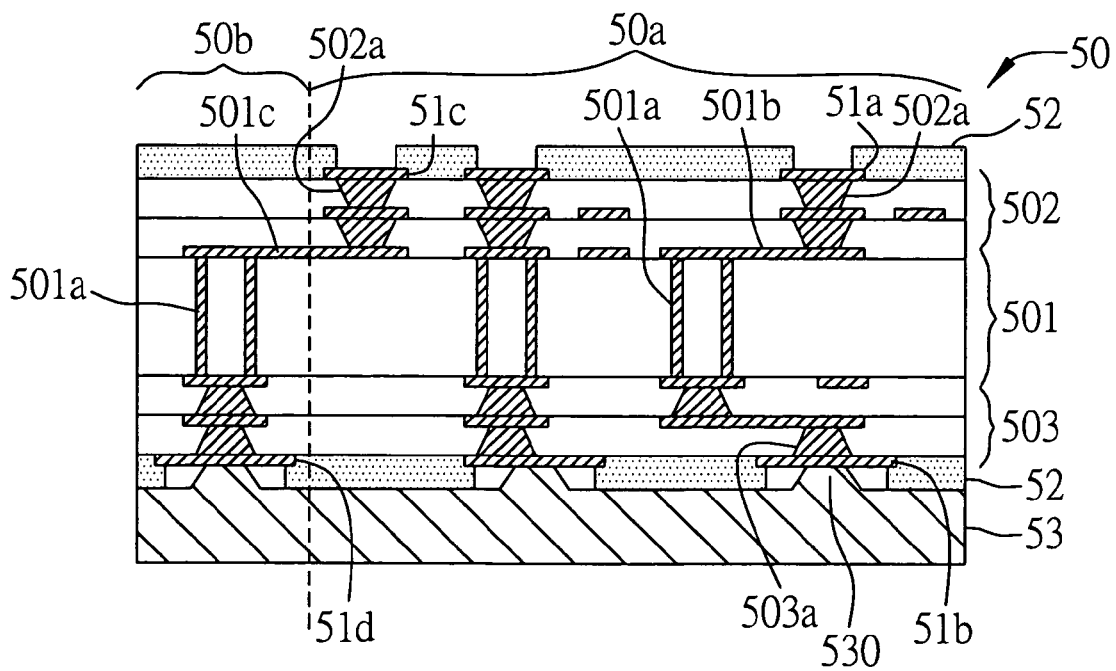

Referring to FIG. 5B, a conductive base 53 is attached to the bottom surface of the circuit board 50. The conductive base can be preferably a metal plate being provided with a plurality of bumps 530, such that the bump can insert into the opening of the insulating layer 52 to connect the pad 51b (including the independent pad 51d located in the electrically inactive area 50b) located on the bottom surface of the circuit board 50.

Figure 5C:
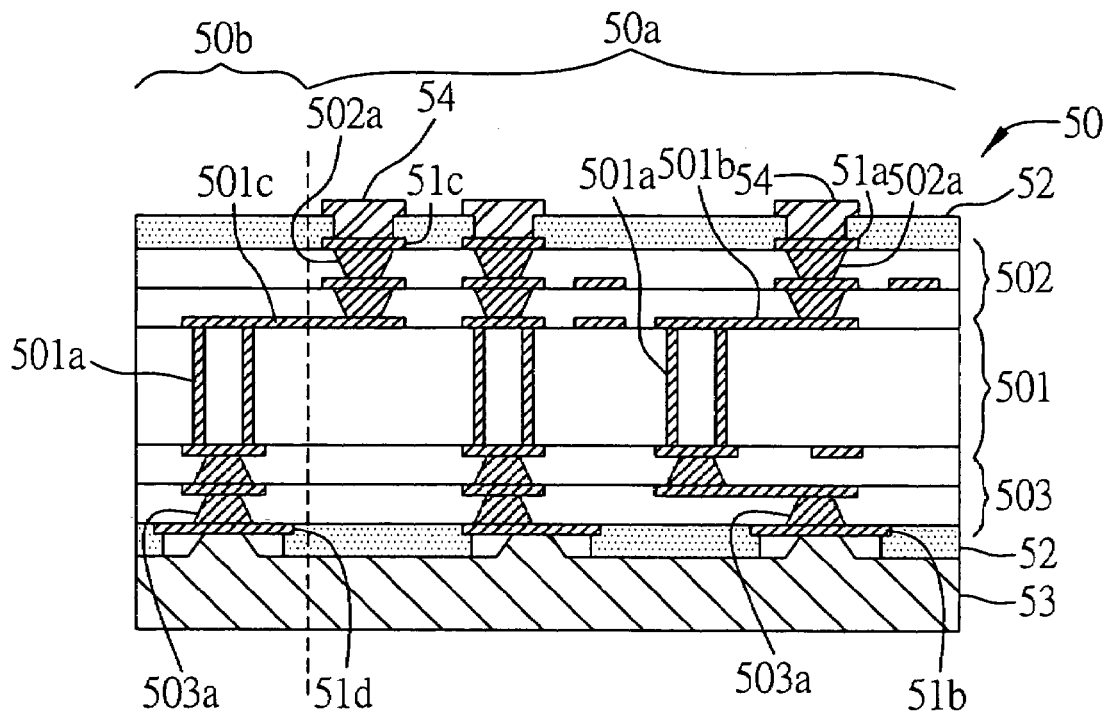

Referring to FIG. 5C, a conductive material 54 such as a solder material is formed on the pad 51a located on the top surface of the circuit board 50 using an electroplating process via conductive structures including the conductive base 53, the pad 51b and the build-up circuit structure 503 located on the bottom surface of the circuit board, the core circuit board 501 and the build-up circuit structure 502 located on the top surface of the circuit board. Also, the conductive material 54 can be formed on the independent pad 51c located on the top surface of the circuit board 50 using an electroplating process via the conductive base 53 and the conductive structures in the electrically inactive area 50b (including the conductive via 503a electrically connected to the bottom of the plated through hole 501a, the plated through hole 501a, and the conductive via 502a formed on the top of the plated through hole 501a). Additionally, apart from the solder material, the conductive material can be a general metal bump, such that the circuit board can be electrically connected to electronic elements by the means of the conductive material.

Figure 5D:
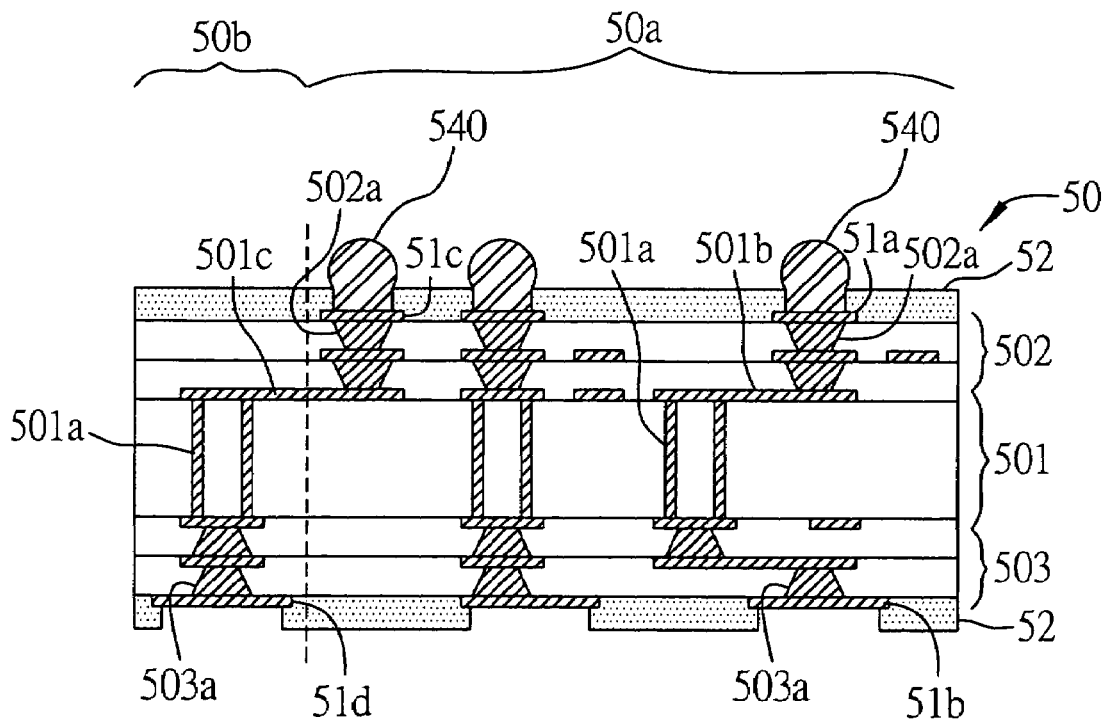
Figure 5E:
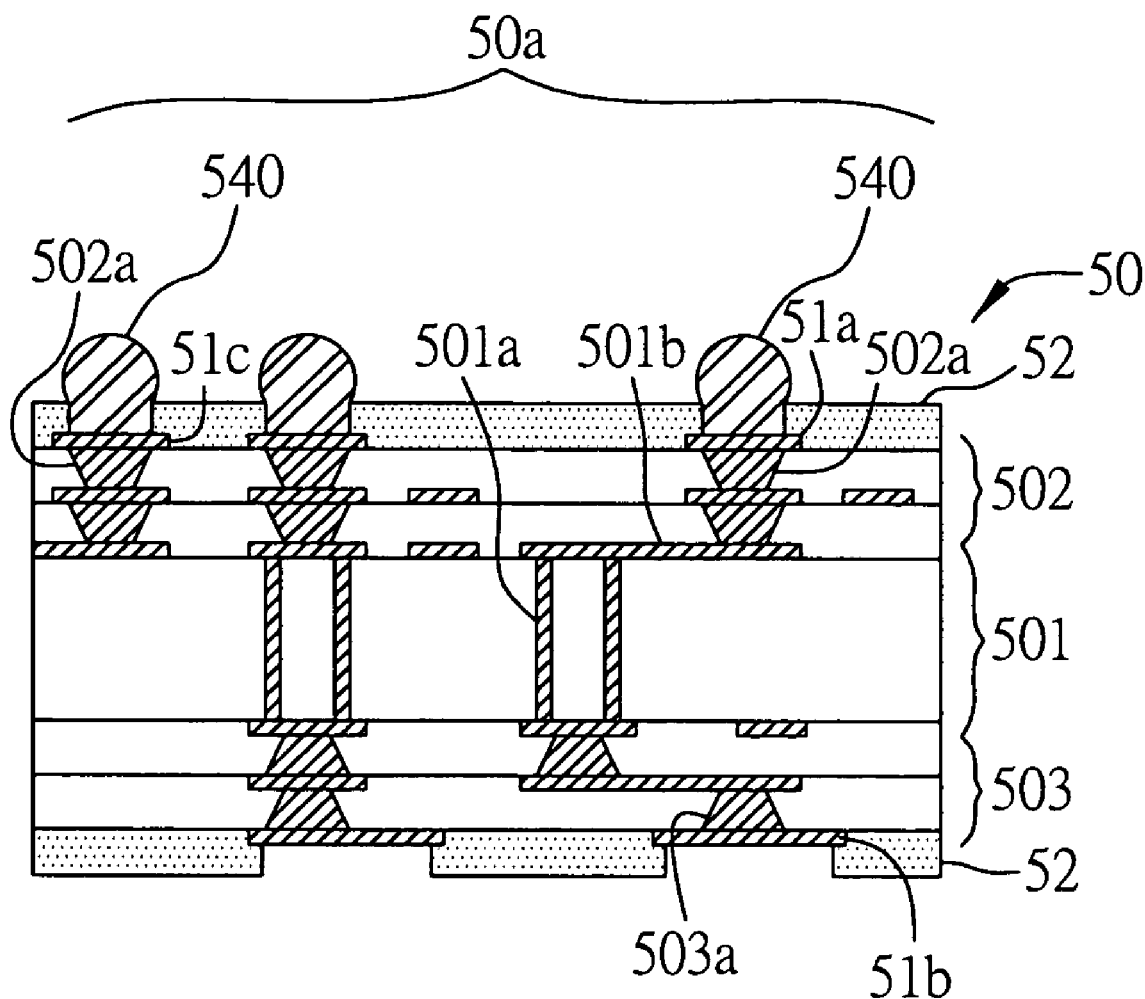

Referring to FIG. 5D, after the conductive material 54 such as the solder material is formed using the electroplating process, the conductive base 53 can be removed. The solder material is subject to a reflow process to form a solder bump 540 and the electrically inactive area 50b of the circuit board is removed (as shown in FIG. 5E).

FIGS. 8A to 8E are cross-sectional views of a method for fabricating an electrical connection structure of a circuit board according to the fourth embodiment of the present invention. The fabrication shown in the fourth embodiment of the present invention is similar to that of the third embodiment. The main difference is that the conductive material formed on the pad using an electroplating process comprises a metal bump and a solder material.

Figure 8A:
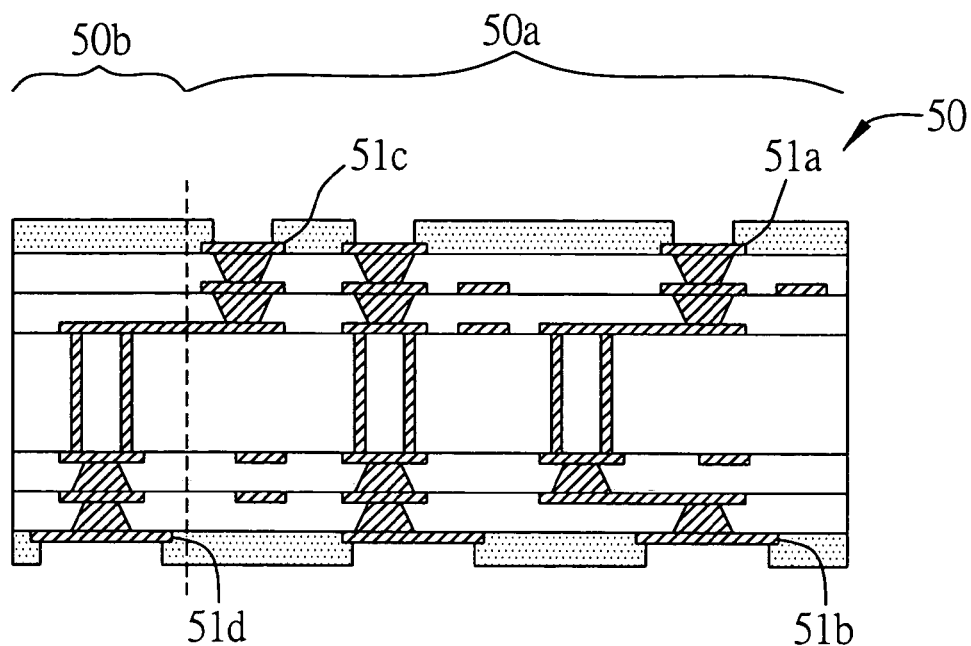
FIGS. 8A to 8E are cross-sectional views of a method for fabricating an electrical connection structure of a circuit board according to the fourth embodiment of the present invention.

Referring to FIG. 8A, a circuit board 80 having an internal circuit being completely electrically connected is provided. The circuit board can be the circuit board shown in FIG. 5A or other various circuit boards having double or multiple layers of circuits.

Figure 8B:
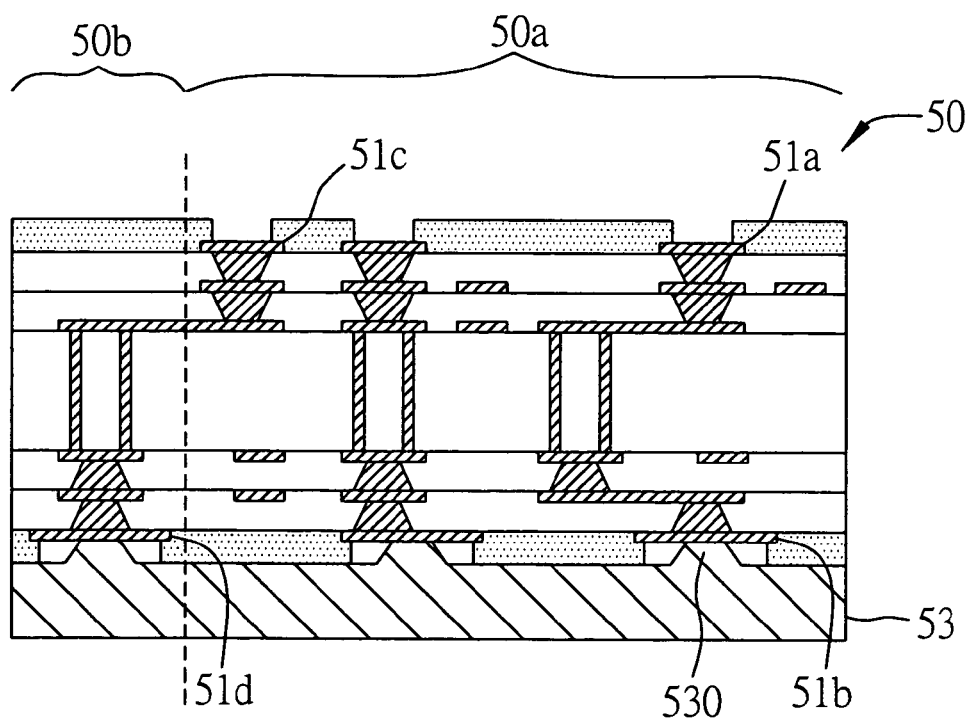

Referring to FIG. 8B, a conductive base 53 such as a metal plate is attached to the bottom surface of the circuit board 50. The metal plate is provided with a plurality of bumps 530, such that the bump can insert into the opening of the insulating layer 52 to connect the pad 51b (including the independent pad 51d located in the electrically inactive area 50b) located on the bottom surface of the circuit board 50.

Figure 8C:
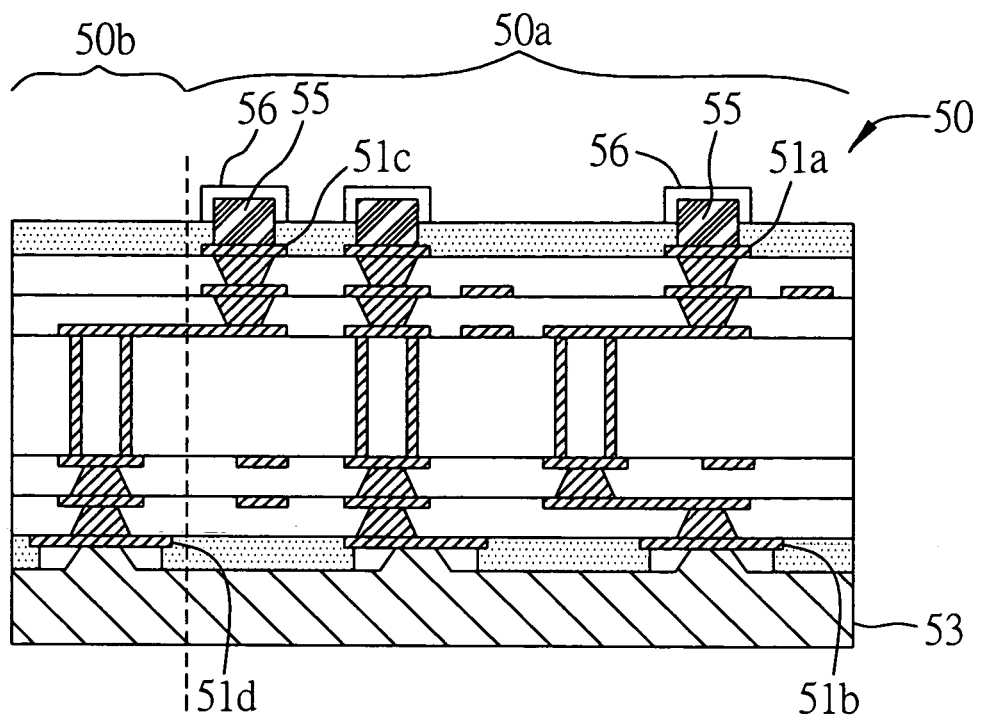

Referring to FIG. 8C, a metal bump 55 such as one made of copper is formed on the pad (including the independent pad 51c located in the electrically active area 50a) located on the top surface of the circuit board using an electroplating process. Subsequently, a solder material 56 is formed on the metal bump 55 using an electroplating process. Thus, the metal bump 55 made of copper can be electroplated using a copper plating material of a lower cost and a higher electroplating speed prior to form the solder material 56 which relatively costs more and has a slower electroplating speed. Therefore, the usage of the solder material 56 can be reduced to minimize the cost and shorten the fabrication time.

Figure 8D:
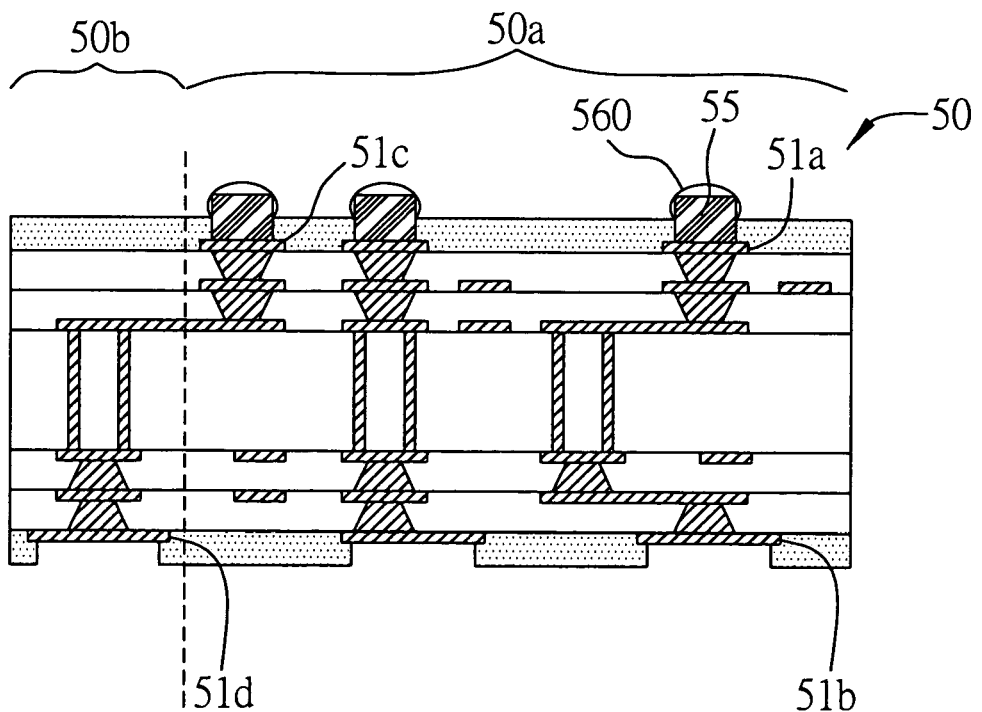
Figure 8E:
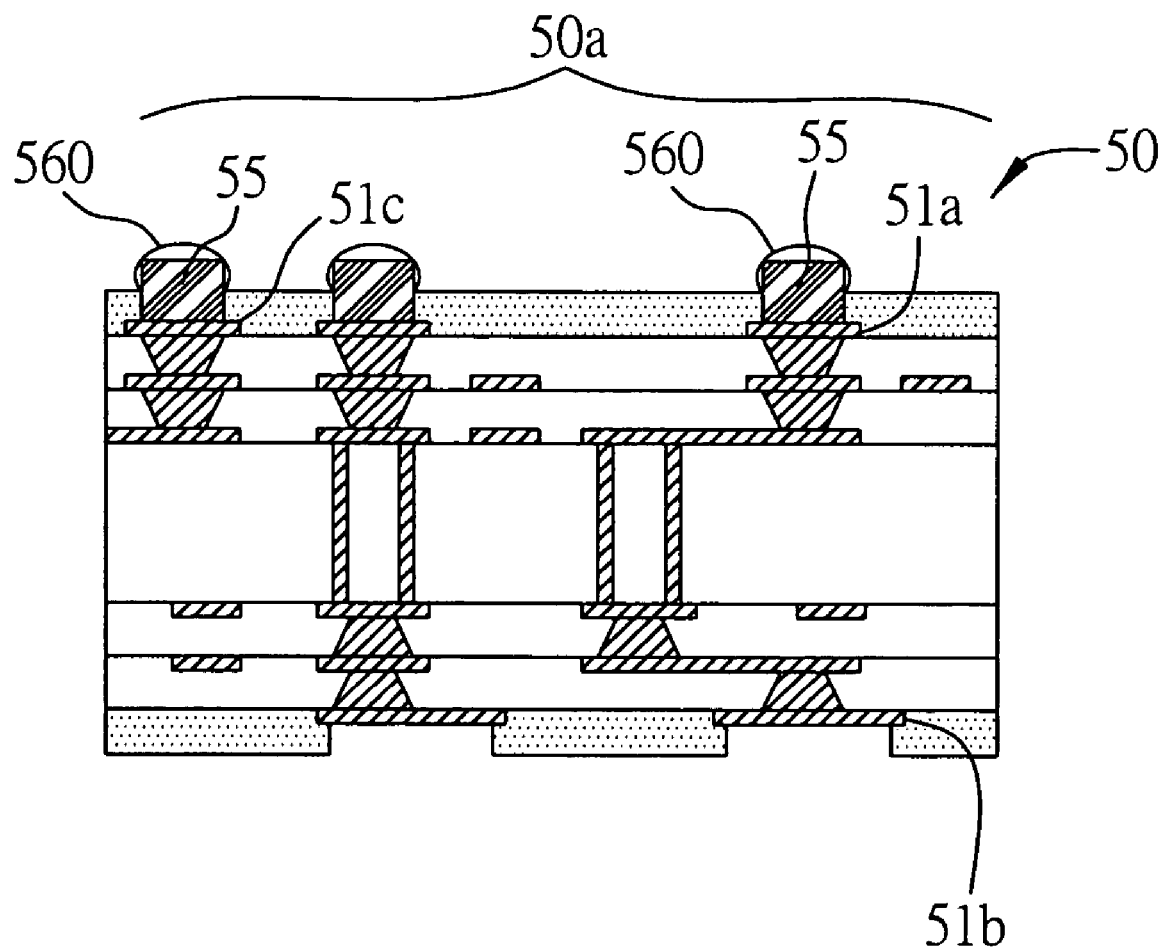

Referring to FIG. 8D, after the conductive materials such as the metal bump 55 and the solder material 56 are formed using an electroplating process, the conductive base 53 can be removed. The solder material 56 is subject to a reflow process to form a solder bump 560 and the electrically inactive area 50b of the circuit board is removed (as shown in FIG. 8E).

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrical connection structure of a circuit board, the method comprising the steps of:
   providing a circuit board having a core circuit board, and the core circuit board having circuits on surfaces thereof and at least one build-up circuit structure formed on top and bottom surfaces of the core circuit board, wherein the build-up circuit structures on the top and bottom surfaces of the core circuit board are electrically interconnected via a plurality of plated through holes formed in the core circuit board, and having a plurality of pads formed on the outmost surfaces of build-up circuit structures thereof, wherein a plurality of conductive vias are formed in the build-up circuit structures and electrically connected to the pads and the plated through holes by conductive circuits, and an insulating layer is applied over the surfaces of the build-up structures and has a plurality of openings for exposing the pads, and the circuit board comprising an electrically active area and an electrically inactive area;
   attaching a conductive base to one of the surfaces of the circuit board, and allowing the conductive base to be electrically connected to the pads on the corresponding surface of the circuit board;
   performing an electroplating process via the conductive base, the pads on the surface of the circuit board, and the conductive structures including conductive vias and conductive circuits formed in the build-up circuit structures and plated through holes formed in the core circuit board to deposit a conductive material on the pads on the other one of the surfaces of the circuit board;
   removing the conductive base; and
   removing the conductive structure in the electrically inactive area of the circuit board.

2. The method of claim 1, wherein the build-up circuit structures are electrically connected to each other and to the core circuit board by the plurality of conductive vias.

3. The method of claim 1, wherein the pads on the surfaces of the circuit board comprise independent pads.

4. The method of claim 3, wherein the independent pads of the circuit board are electrically connected to each other by a plurality of plated through holes pre-formed in the circuit board and conductive vies electrically connected to the plated through holes.

5. The method of claim 3, wherein the independent pads are electrically connected to each other by the plurality of plated through holes formed through the circuit board.

6. The method of claim 3, wherein a conductive structure is formed in the electrically inactive area of the circuit board and electrically connected to the independent pads.

7. The method of claim 6, wherein conductive structure in the electrically inactive area of the circuit board is fabricated by extending a circuit from a top of a plated through hole of the core circuit board located in the electrically inactive area to the electrically active area of the circuit board, such that during fabrication of the build-up circuit structure of the circuit board, a conductive via is electrically connected to and an independent pad is formed on the extended surface, and an independent pad is formed at a conductive via located at a bottom of the plated through hole in the electrically inactive area.

8. The method of claim 6, wherein the conductive structure in the electrically inactive area of the circuit board is fabricated by electrically connecting conductive vias to a top and a bottom of a plated through hole of the core circuit board located in the electrically inactive area of the circuit board, thereby allowing the conductive via at the bottom to form an independent pad, and extending a circuit from the conductive via at the top to an independent pad located in the electrically active area of the circuit board.

9. The method of claim 6, wherein the conductive structure in the electrically inactive area of the circuit board is fabricated by electrically connecting conductive vias to a top and a bottom of a plated through hole of the core circuit board located in the electrically inactive area of the circuit board, thereby allowing the conductive via at the bottom to form an independent pad, and extending a circuit from the conductive via at the top to the electrically active area and forming a conductive via and an independent pad on the extended circuit.

10. A method for fabricating an electrical connection structure of a circuit board, the method comprising the steps of:
provides a circuit board having a plurality of pads formed on surfaces thereof, wherein a plurality of conductive structures are formed in the circuit board and electrically connected to the pads, and an insulating layer is applied over the surfaces of the circuit board and has a plurality of openings for exposing the pads;

attaching a conductive base to one of the surfaces of the circuit board, and allowing the conductive base to be electrically connected to the pads on the corresponding surface of the circuit board;

performing an electroplating process via the conductive base, the pads on the surface of the circuit board, and the conductive structures formed in the circuit board to deposit a conductive material on the pads located on the other one of the surfaces of the circuit board, wherein the pads on the surfaces of the circuit board comprise independent pads, and the circuit board comprises an electrically active area and an electrically inactive area;

forming a conductive structure in the electrically inactive area of the circuit board, and electrically connected to the independent pads; and after depositing the conductive material on the pads of the circuit board, removing the conductive structure in the electrically inactive area of the circuit board.

11. A method for fabricating an electrical connection structure of a circuit board, the method comprising the steps of:
providing a circuit board having a plurality of pads formed on surfaces thereof, wherein a plurality of conductive structures are formed in the circuit board and are electrically connected to the pads, and an insulating layer is applied over the surfaces of the circuit board and has a plurality of openings for exposing the pads;

attaching a conductive base to one of the surfaces of the circuit board, and allowing the conductive base to be electrically connected to the pads on the corresponding surface of the circuit board;

performing an electroplating process via the conductive base, the pads on the surface of the circuit board, and the conductive structures formed in the circuit board to deposit a conductive material on the pads located on the other one of the surfaces of the circuit board, wherein the circuit board comprises a core circuit board having circuits on surfaces thereof and a plurality of build-up circuit structures formed on a top and a bottom surfaces of the core circuit board and the pads on the surfaces of the circuit board comprise independent pads;

forming a conductive structure in the electrically inactive area of the circuit board, and electrically connected to the independent pads; and after depositing the conductive material on the pads of the circuit board, removing the conductive structure in the electrically inactive area of the circuit board.

* * * * *